United States Patent
Sakamoto

[11] Patent Number: 5,808,352
[45] Date of Patent: Sep. 15, 1998

[54] SEMICONDUCTOR APPARATUS HAVING CRYSTAL DEFECTS

[75] Inventor: Kazuhisa Sakamoto, Kyoto, Japan

[73] Assignee: Rohm Co., Ltd., Kyoto, Japan

[21] Appl. No.: 716,420

[22] PCT Filed: Feb. 19, 1996

[86] PCT No.: PCT/JP96/00368

§ 371 Date: Sep. 20, 1996

§ 102(e) Date: Sep. 20, 1996

[87] PCT Pub. No.: WO96/26536

PCT Pub. Date: Aug. 29, 1996

[30] Foreign Application Priority Data

Feb. 20, 1995 [JP] Japan .................................. 7-031148

[51] Int. Cl.⁶ .................. H01L 29/74; H01L 27/082; H01L 29/30
[52] U.S. Cl. ................ 257/590; 257/156; 257/617
[58] Field of Search .................................. 257/156, 590, 257/610, 611, 612, 617

[56] References Cited

U.S. PATENT DOCUMENTS 4,165,517  8/1979  Temple et al. .......................... 257/156
4,585,489  4/1986  Hiraki et al. ........................... 438/764

FOREIGN PATENT DOCUMENTS 57-197848  4/1982  Japan .
58-17678   2/1983  Japan .
62-298120  12/1987 Japan .

Primary Examiner—Wael Fahmy
Attorney, Agent, or Firm—Baker & Botts, L.L.P

[57] ABSTRACT

It is an object to provide a semiconductor apparatus having both fast switching characteristics and high dielectric breakdown strength or small leakage current characteristics, as well as a process for fabricating such improved semiconductor apparatus. The apparatus comprises a semiconductor substrate; a semiconductor layer on said semiconductor substrate, said semiconductor layer having a pn junction formed along the surface of said semiconductor substrate, wherein crystal defects being formed by irradiation with particle rays to the only vertical direction of said pn junction; and a silicon nitride film provided on the substrate surface of said layer for restraining the exposure to particle rays being provided on the substrate surface of said element in the areas other than said pn junction.

3 Claims, 4 Drawing Sheets

SEMICONDUCTOR APPARATUS HAVING CRYSTAL DEFECTS

TECHNICAL FIELD

The present invention relates to semiconductor apparatus such as diodes, transistors, thyristors and MOSFETs and a process for fabricating them. More particularly, the invention relates to semiconductor apparatus that have not only fast switching characteristics but also high breakdown voltage or small leakage current characteristics. The invention also relates to a process for fabricating such semiconductor apparatus.

BACKGROUND ART

It has been known that semiconductor apparatus having a pn junction can be provided with fast switching or response characteristics by shortening the lifetime of carriers either through diffusion of heavy metals such as gold and platinum or through irradiation with particle rays such as electron beams, X-rays and proton rays.

The method of diffusing gold, platinum and other heavy metals into the semiconductor layer has long been studied but the difficulties involved in controlling the amount of diffusion and achieving uniform diffusion have presented the problem of a comparatively poor correlationship between current amplification factor and storage time ($h_{FE}$-$t_{stg}$) in devices such as transistors. In addition, the need for taking care to prevent the contamination of apparatus such as a post-treatment furnace is a great burden in process control.

The second approach which relies upon irradiation with particle rays aims at shortening the lifetime of carriers by means of the high energy of particle rays which create defects in the crystals of the semiconductor layer so as to form deep energy levels. The restraint on this approach is that it must be implemented in the later stage of the fabrication sequence for the semiconductor apparatus since the created crystal defects will revert to the initial state in terms of the lifetime of carriers and become no longer effective. What is more, the overall exposure of the semiconductor apparatus to particle rays causes additional disadvantages such as reduced dielectric breakdown strength and an excessive exposure to particle rays will deteriorate the electrical characteristics of the semiconductor apparatus.

A method of preventing the drop of dielectric breakdown strength due to exposure to particle rays such as electron beams is disclosed in Unexamined Published Japanese Patent Application (kokai) No. 17678/1983 and characterized in that the crystal defects in the surface of a semiconductor layer which is most prone to experience a drop in dielectric breakdown strength are repaired by annealing which is typically implemented by exposure to electron beams.

U.S. Pat. No. 4,585,489 also discloses a method of ensuring against the drop in dielectric breakdown strength due to irradiation with particle rays such as electron beams. If the semiconductor substrate is exposed to particle rays, the $SiO_2$ layer on the substrate surface is damaged and positive charges are generated in it, thereby reducing the dielectric breakdown strength. To solve this problem, U.S. Pat. No. 4,585,489, supra, proposes that the $SiO_2$ layer be removed before providing a semi-insulating layer that is resistant to radiation damage and which is typically formed of oxygen and/or nitrogen containing polycrystalline or amorphous silicon, thereby assuring that no fixed charges will remain in the semi-insulating film. Thereafter, the semiconductor substrate is irradiated with an electron beam to control the lifetime of carriers without reducing the dielectric breakdown strength.

U.S. Pat. No. 4,165,517 teaches a thyristor having a gate region of selective high transport factor $\alpha_G$. This is achieved either by uniform irradiation of a semiconductor substrate with particle rays such as electron beams in order to shorten the lifetime of carriers and then annealing only the gate region to repair the crystal defects it contains, or by providing a shield such as a lead foil on the surface of the gate region and then irradiating the substrate uniformly with particle rays such as electron beams while protecting the gate region against the creation of crystal defects, or by introducing heavy metals into the areas of the substrate other than the gate region through diffusion or ion implantation. By either of these methods, the lifetime of carriers can be shortened in a selective region of the semiconductor substrate.

The method described in Unexamined Published Japanese Patent Application (kokai) No. 17678/1983, supra, which anneals the surface of the semiconductor substrate to repair the crystal defects present is capable of preventing the drop in the dielectric breakdown strength of the substrate surface due to irradiation with particle rays such as electron beams. However, this method is by no means effective in preventing the drop that may occur in the interior portions, particularly the cylindrical or spherical parts of the pn junction having great curvatures or the field region having the extending depletion layer.

Another problem with this technique is that in the case of a MOSFET, irradiation with particle rays such as electron beams creates positive charges or other minority carriers in the gate insulating film, thereby increasing the gate-to-source leakage current.

In the method disclosed in U.S. Pat. No. 4,165,517, exposure to particle rays such as electron beams has to be conducted through a mask in order to ensure the localized irradiation of the semiconductor substrate and the mask is made of a heavy metal such as lead. This not only introduces difficulty in handling due to the need to provide protection against wafer contamination but also requires the removal of the mask after the end of irradiation. The reason is that upon heat treatments, the heavy metals such as lead will diffuse into the silicon film and act as lifetime killers that interfere with the precise control of carrier lifetime. The diffused heavy metals will also contaminate the diffusion furnace to cause increased leakage. What is more, the removal of the mask is prone to cause misalignment between the forming pattern and the mask pattern for exposure to an electron beam and this in turn causes a mismatch between the region under the pn junction where the lifetime of carriers has to be shortened and the curvatures of the pn junction which must have an improved breakdown voltage. If this mismatch occurs, it may be impossible to attain satisfactory results in both switching and dielectric breakdown strength characteristics.

U.S. Pat. No. 4,165,517 teaches the use of a selective mask for irradiation with particle rays such as electron beams but it gives no specific information about which part of the structure should be masked in order to produce a semiconductor apparatus that has fast switching and high dielectric breakdown strength or small leakage current characteristics.

DISCLOSURE OF INVENTION

The present invention has been accomplished under these circumstances and has as an object providing a semiconductor apparatus that has fast switching characteristics, as well as high dielectric breakdown strength or small leakage current characteristics.

Another object of the invention is to provide a process for fabricating such improved semiconductor apparatus.

The present inventors conducted intensive studies in order to develop a semiconductor apparatus meeting both requirements for fast switching characteristics and high dielectric breakdown strength or small leakage current characteristics. As a result, it has been found that fast switching characteristics can be attained by shortening the lifetime of carriers in the vertical direction of a horizontally formed pn junction (above or below a pn junction formed parallel to a major surface of a semiconductor substrate) and that no significant effects occur in the transverse direction of a vertically formed pn junction (right or left to a pn junction formed vertical to a major surface of a semiconductor substrate). In the light of these findings, only the region of a semiconductor substrate where a pn junction is formed horizontally is exposed to particle rays such as electron beams, thereby creating crystal defects and shortening the lifetime of carriers by a sufficient degree to provide fast switching characteristics; at the same time, the area exterior to a vertically formed pn junction is prevented from exposure to particle rays such as electron beams, whereby the creation of crystal defects is prevented and high dielectric breakdown strength is maintained.

The mask for selective exposure to particle rays such as electron beams is conventionally made of heavy metal materials such as lead. However, as already mentioned, heavy metal materials are difficult to handle without causing wafer contamination or mask misalignment. The present inventors conducted intensive studies to solve this problem and found the following: the penetration of particle rays through the mask dropped markedly as the density of the mask material increased; even when a small amount of ray particles were admitted into the semi-conductor layer, the high-density mask material sufficiently attenuated the energy of the ray particles to prevent the occurrence of a significant drop in the dielectric breakdown strength; even a silicon nitride film having a density of about 2.4–3.1 g/cm³ was useful as a practical mask of ray particles when its thickness was in the range from 0.1 to several microns or more. Typical examples of the ray particles contemplated for use in the invention are electron beams, X-rays and proton beams.

The semiconductor apparatus according to the first aspect of the invention comprises a device that has a pn junction formed along the surface of a semiconductor substrate, with crystal defects being formed by irradiation with particle rays in such a way that they are limited to the vertical direction of said pn junction whereas a silicon nitride film for restraining the exposure to particle rays is provided on the substrate surface of said in the areas other than said pn junction.

In a preferred embodiment, said device is a bipolar transistor and said crystal defects are formed in both the base region of said transistor and the collector region under said base region, with said silicon nitride Film being provided on said substrate surface extending in the areas external to the perimeter of said base region. This arrangement effectively shortens the base-to-collector storage time $t_{stg}$ to provide fast switching characteristics; in addition, the curvatures of the pn junction or the field region having the extending depletion layer will experience no drop in dielectric breakdown strength due to crystal defects and, hence, can maintain high breakdown voltage.

In another preferred embodiment, said device is a vertical MOSFET comprising a semiconductor layer of a first conduction type, a semiconductor region of a second conduction type that is provided in said semiconductor layer and that has a channel region at either end and a source region provided at either end of said semiconductor region of a second conduction type, said crystal defects being formed both within and below said semiconductor region of a second conduction type in said vertical MOSFET whereas said silicon nitride film is provided above the gate electrode of said vertical MOSFET. This arrangement is also effective in providing the vertical MOSFET with fast switching characteristics and, at the same time, it is capable of maintaining the gate-to-source leakage current at a reasonably small level.

The process according to the second aspect of the invention is for fabricating a semiconductor apparatus which has the lifetime of carriers controlled by irradiating a semiconductor layer with particle rays and it is characterized in that said semiconductor layer is selectively irradiated with particle rays through a silicon nitride film which is used as a mask.

In a preferred embodiment, the irradiation with said particle rays is selectively performed on that area of said semiconductor layer in which a pn junction is formed along the substrate surface of said semiconductor layer. This technique is effective in sufficiently shortening the lifetime of carriers to provide fast switching characteristics and also contributes to the fabrication of a semiconductor apparatus having high dielectric breakdown strength or small leakage current characteristics.

According to the present invention, crystal defects due to the irradiation with particle rays such as electron beams are formed only in the area that is below a pn junction formed parallel to the surface of the semiconductor substrate of a such as a transistor. On account of the crystal defects, the lifetime of carriers for the greater part of the current flowing through the pn junction is sufficiently shortened in the conduction path to provide faster switching characteristics. On the other hand, few crystal defects occur in that area of the semiconductor layer which is external to the perimeter of a vertically formed pn junction since the particle rays admitted into that area are sufficiently attenuated by the silicon nitride film formed as a mask on the surface of that area; hence, there will be neither a drop in the dielectric breakdown strength nor an increase in the leakage current that would occur if crystal defects were present. The dielectric breakdown strength is most prone to drop in the curvatures of the pn junction such as the cylindrical or spherical parts or in the field region with the extending depletion layer but according to the invention, there will be no further drop in the dielectric breakdown strength due to crystal defects and, hence, a high breakdown voltage can be maintained.

The silicon nitride film used as a mask for selective exposure to particle rays has the added advantage that it can be used in a higher-temperature process step than the leaded glass ($T_g \approx 600°$ C.) and this enables the use of a self-aligned structure.

The semiconductor apparatus and the process for its fabrication according to the present invention will now be described with reference to the accompanying drawings.

BEST MODE FOR CARRYING OUT THE INVENTION

The semiconductor apparatus of the invention comprises a device that has a pn junction formed along the surface of a semiconductor substrate, with crystal defects being formed by irradiation with particle rays in such a way that they are limited to the vertical direction of said pn junction whereas a silicon nitride film for restraining the exposure to particle rays is provided on the substrate surface of said in the areas other than said pn junction.

As already mentioned, the present inventors conducted intensive studies in order to develop a semiconductor apparatus meeting both requirements for fast switching characteristics and high dielectric breakdown strength or small leakage current characteristics and found that when the lifetime of carriers was shortened by applying particle rays such as electron beams in the vertical direction of a pn junction formed parallel to the surface of the semiconductor substrate of a, there were no significant effects on carriers that would flow through a vertically formed pn junction. What is more, a silicon nitride film is provided over the vertically formed pn junction to prevent the admission of particle rays and the curvatures of the pn junction as well as the field region with the extending depletion layer which are particularly low in dielectric breakdown strength will not undergo any further drop in this parameter but maintain a practically acceptable breakdown voltage. As a result, fast switching characteristics are attained and, in addition, a semiconductor apparatus having high dielectric breakdown strength or small leakage current characteristics is provided. These features of the invention are described below in detail with reference to two specific examples.

EXAMPLE 1

Figure 1:
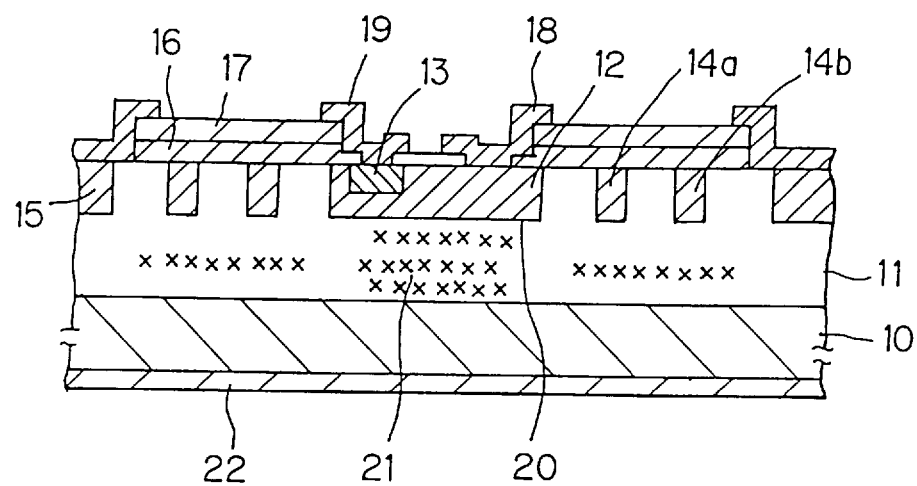
FIG. 1 is a sectional view of a semiconductor apparatus according to Example 1 of the invention.

Reference should first be made to FIG. 1. A typically n⁺ type semiconductor substrate 10 has an n-type semiconductor layer 11 formed thereon to provide a collector region. A p-type base region 12 is formed in the surface of the collector region 11 and an n⁺ type emitter region 13 is formed in the base region 12. The base region 12 is surrounded with FLRs (field-limiting regions) 14a and 14b for allowing a pn junction 20 between the base region 12 and the collector region 11 to extend beyond the perimeters of these FLRs, which in turn are surrounded by an annular ring 15 for stabilizing surface charges. A protective film 16 typically made of SiO and a silicon nitride film 17 typically made of Si N for restraining the exposure to particle rays are provided on the surface of the semiconductor layer 11 in the area which is external to the perimeter of the base region 12 and which represents the field region. A base electrode 18 and an emitter electrode 19 which are typically made of aluminum are provided on the surface of the semiconductor layer 11 via a contact hole. A collector electrode 22 is provided on the back surface of the semiconductor substrate 10.

To fabricate the transistor of Example 1, the silicon nitride film 17 is provided before the semi-conductor layer 11 is given overall exposure to an electron beam to create crystal defects 21 in that layer 11. Many crystal defects 21 are formed under the base region 12 but only few crystal defects 21 are created in the field region which surrounds the base region 12 (the number of crosses in FIG. 1 is a relative measure of the number of crystal defects present). Thus, the silicon nitride film 17 which restrains the exposure to an electron beam is provided in the surface of the semiconductor layer 11 to cover the field region before actual exposure to electron beams. Because of this configuration, an electron beam is admitted unattenuated into the semiconductor layer 11 in the base region 12 which has no overlying silicon nitride film, thereby creating many crystal defects 21. On the other hand, the field region which is provided with the silicon nitride film 17 effectively restrains the penetration of the electron beam so that only a limited amount of the electron beam will reach the semiconductor layer 11 to create a correspondingly smaller number of crystal defects 21.

The surface of the semiconductor layer 11 is also provided with the protective film 16 which is typically made of $SiO_2$ as in the case of a diffusion mask and this film partially overlaps the base region 12. However, silicon oxide (e.g. $SiO_2$) films have densities of about 2.1–2.3 g/cm³ and an electron beam will penetrate them to substantially the same depth as it penetrates the silicon in the semiconductor layer; hence, the protective film 16 does not serve as a mask. On the other hand, the silicon nitride film has a greater density and the one that is formed by LPCVD (low-pressure CVD) has typically densities of about 2.9–3.1 g/cm³ and by adjusting its thickness to about 0.1–5 μm, the film is provided with a sufficient ability to restrain the penetration of electron beams. The silicon nitride film formed by plasma-assisted CVD has somewhat lower densities of about 2.4–2.8 g/cm³ but these values are still greater than those for the silicon oxide films and by adjusting the thickness of that film to about 0.5–10 μm, it can effectively be used as a mask for restraining the penetration of particle rays such as electron beams.

The transistor of Example 1 is fabricated by performing exposure to particle rays such as an electron beam after the provision of the silicon nitride film 17 and, hence, the lifetime of carriers is sufficiently shortened in the dominant current path under the base region 12 to provide fast switching characteristics. On the other hand, the exposure to electron beams is restrained in the field region by means of the silicon nitride film 17 and the creation of crystal defects 21 is suppressed accordingly to ensure against the drop in dielectric breakdown strength. The crystal defects 21 created upon irradiation with an electron beam are repaired by annealing at 450° C. or below, so exposure to an electron beam is preferably performed after the post-diffusion anneal step which is conducted at elevated temperatures. In contrast, the silicon nitride film 17 can safely be left intact on the final product without causing any problems. Therefore, irradiation with an electron beam may be performed at all times subsequent to annealing. On the other hand, the silicon nitride film 17 can withstand elevated temperatures and, hence, may be formed at the early stage of a fabrication process for the transistor; if desired, the film may also serve as a mask to form the base region 12.

Figure 2:
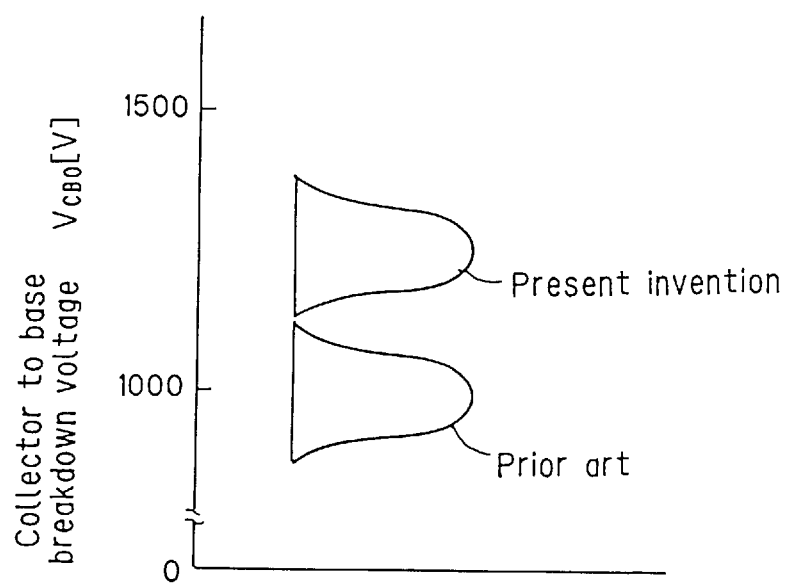
FIG. 2 is a diagram showing the profile of the breakdown voltage of the semiconductor apparatus of Example 1.

FIG. 2 shows the profile of the collector-to-base breakdown voltage of the transistor of Example 1 as compared to that of the breakdown voltage of a transistor fabricated by the prior art process involving overall exposure to an electron beam. Obviously, the product of Example 1 had breakdown voltages of about 1,300 volts and was by far improved over the prior art product which had breakdown voltages of about 900 volts. Both data were taken on 20 samples each and the two transistors had little differences in switching characteristics.

EXAMPLE 2

Figure 3:
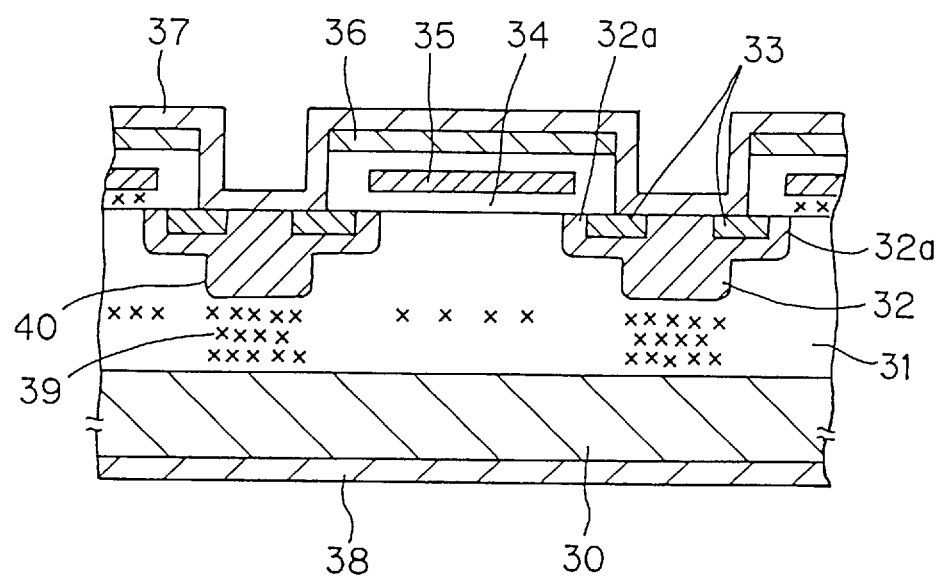
FIG. 3 is a sectional view of a semiconductor apparatus according to Example 2 of the invention.

The concept of the invention for controlling the lifetime of carriers was applied to a vertical MOSFET. Reference should first be made to FIG. 3. A semiconductor substrate 30 of a first conduction type, say, $n^+$ type has formed thereon an n-type semiconductor layer 31, a semiconductor region 32 of a second conduction type, say, p-type, with the channel region indicated by 32a, $n^+$ type source regions 33, a gate insulator film 34, a gate electrode 35, a silicon nitride film 36 for restraining the exposure to particle rays such as electron beams, a source electrode 37 and a drain electrode 38. Crystal defects 39 which have been created by exposure to particle rays such as electron beams are designated by the same convention as in FIG. 1. To gain a large current, the MOSFET shown in FIG. 3 has a matrix of many cells that each consist of the source regions 33 and the channel region 32a and which are formed within the semiconductor layer 31 providing the drain region. A current flows vertically from the source regions 33 of each cell through the channel region 32a to the back surface of the semiconductor layer 31 and the sum of such currents flowing through all cells that are present provides the drain current of the MOSFET. In a MOSFET of the type under discussion, a pn junction 40 is formed between the p-type region 32 and the n-type semiconductor layer 31 and a diode is established in this region. Loss will occur if this diode, generally called a "built-in diode" has a long reverse recovery time (trr). In Example 2, an electron beam is applied to this region to create crystal defects 39, whereby the lifetime of carriers is sufficiently shortened to reduce the reverse recovery time (trr) of the built-in diode (i.e. enable its quick reverse recovery).

If the entire surface of the semiconductor layer 31 is exposed to an electron beam, positive charges will be generated in the gate oxide film 34 (typically made of $SiO_2$) which underlies the gate electrode 35 and the gate-to-source leakage current will flow in an increased amount.

However, the silicon nitride film 36 provided in Example 2 over the gate electrode 35 effectively restrains the exposure to an electron beam and, hence, the generation of positive charges in the gate insulator film 34. As a consequence, Example 2 ensures against the increase in leakage current while providing faster switching characteristics.

Figure 4:
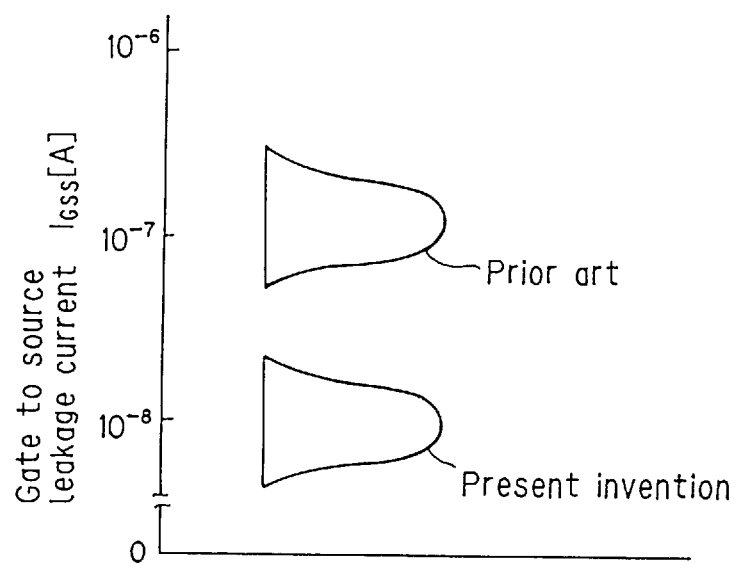
FIG. 4 is a diagram showing the profile of the gate-to-source leakage current of the semiconductor apparatus of Example 2.

FIG. 4 shows the profile of the gate-to-source leakage current $I_{GSS}$ of the vertical MOSFET of Example 2, as measured on 20 samples. FIG. 4 also shows as comparative data the profile of the $I_{GSS}$ of a vertical MOSFET that had the switching characteristics improved by the prior art overall exposure to an electron beam. Obviously, the leakage current flowing through the invention transistor was about one tenth the value for the prior art product.

INDUSTRIAL APPLICABILITY

According to the present invention which aims at increasing the switching speed of semiconductor apparatus having a pn junction, a silicon nitride film is used as a mask for selective irradiation of the necessary region with particle rays such as an electron beam and this is effective in sufficiently shortening the lifetime of carriers flowing across the pn junction (the dominant current path) so that the desired fast switching characteristics are attained. The semiconductor apparatus of the invention also has high dielectric breakdown strength or small leakage current characteristics.

The silicon nitride film used as a mask for selective exposure to particle rays has the added advantage that unlike the conventional mask typically made of leaded glass, the film can be used as such in a high-temperature process step as exemplified by the formation of a gate protective film and this enables the use of a self-aligned structure. As a consequence, one can easily achieve alignment between the region to be irradiated with particle rays and the region where a of interest is formed and this enables the fabrication of a semiconductor apparatus that is further improved in both switching characteristics and dielectric breakdown strength or leakage current characteristics.

I claim:

1. A semiconductor apparatus comprising:

a semiconductor substrate;

a semiconductor layer on a surface of said semiconductor substrate, said semiconductor layer having a pn junction formed along the surface of said semiconductor substrate, wherein crystal defects are formed by irradiation with particle rays only in the vertical direction from said pn junction; and a silicon nitride film having a density of at least 2.4 $g/cm^3$ and a thickness in the range from 0.1 $\mu m$ to 5 $\mu m$ provided on a surface of said semiconductor layer for restraining the exposure to particle rays being provided on said substrate surface of said apparatus in areas other than said pn junction.

2. A semiconductor apparatus according to claim 1, wherein said apparatus is a bipolar transistor and said crystal defects are formed in both a base region of said transistor and a collector region under said base region, with said silicon nitride film being provided on said surface of said semiconductor layer in areas external to a perimeter of said base region.

3. A semiconductor apparatus according to claim 1, wherein said apparatus is a vertical MOSFET comprising a semiconductor layer of a first conduction type, a semiconductor region of a second conduction type that is provided in said semiconductor layer and that has two ends and a channel region at each end and a source region provided at each end of said semiconductor region of a second conduction type, said crystal defects being formed both within and below said semiconductor region of a second conduction type in said vertical MOSFET whereas said silicon nitride film is provided above a gate electrode of said vertical MOSFET.

* * * * *